US006432753B1

(12) United States Patent
Abesingha et al.

(10) Patent No.: US 6,432,753 B1
(45) Date of Patent: Aug. 13, 2002

(54) METHOD OF MINIMIZING PACKAGE-SHIFT EFFECTS IN INTEGRATED CIRCUITS BY USING A THICK METALLIC OVERCOAT

(75) Inventors: Buddhika J. Abesingha, Plano; Gabriel A. Rincon-Mora, Allen; David D. Briggs, Richardson; Roy Alan Hastings, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/840,246

(22) Filed: Apr. 23, 2001

(51) Int. Cl.⁷ .............................................. H01L 21/44
(52) U.S. Cl. ....................... 438/127; 438/106
(58) Field of Search ................. 438/112, 124, 438/126, 127, 106

(56) References Cited

U.S. PATENT DOCUMENTS 5,389,158 A * 2/1995 Frass et al. ................. 136/244
5,739,796 A * 4/1998 Jasper, Jr. et al. .......... 343/895
5,861,707 A * 1/1999 Kumar ....................... 313/309
6,072,116 A * 6/2000 Brandhorst, Jr. et al. ... 136/253
6,221,696 B1 * 4/2001 Crema et al. ............... 438/127
6,309,959 B1 * 10/2001 Wang et al. ................ 438/625

* cited by examiner

*Primary Examiner*—Michael J. Sherry
*Assistant Examiner*—Scott Geyer
(74) *Attorney, Agent, or Firm*—W. Daniel Swayze, Jr.; W. James Brady; Frederick J. Telecky, Jr.

(57) ABSTRACT

A structure and method of minimizing package-shift effects in integrated circuits is implemented by using a thick metallic overcoat applied after the deposition and patterning of the conventional insulating protective overcoat. The metallic overcoat most preferably comprises a layer of electrolytically deposited copper approximately 15 $\mu$m thick that is patterned to provide for electrically independent regions; but an unbroken area of the metallic overcoat is left over any sensitive analog circuitry, such as a bandgap reference circuit. The thick metallic coating, in addition to minimizing package-shift effects, is also useful as a low-resistance routing layer. The metallic overcoat is sufficiently thin to allow low-profile packaging. The method employs a conductive overcoat that is significantly thin compared to conventional insulating conformal overcoats.

17 Claims, 5 Drawing Sheets

METHOD OF MINIMIZING PACKAGE-SHIFT EFFECTS IN INTEGRATED CIRCUITS BY USING A THICK METALLIC OVERCOAT

BACKGROUND OF THE INVENTION

1. Field of the Invention

This invention relates generally to integrated circuits, and more particularly to a method of minimizing package-shift effects in integrated circuits containing bandgap references or other sensitive circuits by using a relatively thick metallic overcoat.

2. Description of the Prior Art

Bandgap references are used in a wide variety of integrated systems where accurate and precise voltage references with excellent line regulation and temperature stability performance are required. FIG. 1 shows a typical first-order Brokaw type bandgap circuit 100 realized in a BiCMOS technology. Bandgap references are critical in systems such as linear and switching regulators, analog-to-digital converters, digital-to-analog converters, and other like circuits where accuracy and precision as a whole are in great demand. Bandgap references play a pivotal role in determining the accuracy and precision of these systems. Circuit designers therefore employ different types of trimming techniques and algorithms to compensate for process variations, temperature, and complex second-order and third-order effects.

Bandgap references encapsulated in plastic packages however, exhibit a characteristic shift in voltage. Once the bandgap reference circuit is packaged in plastic, the bandgap reference output voltage differs from its original, non-packaged value. This package shift, unfortunately, is not completely consistent from unit to unit, even if the same encapsulant and packaging technique is used. This randomness is detrimental since designers cannot easily account for it in the design phase. In view of the foregoing, there is a need for a method to minimize package-shift effects in sensitive integrated circuits such as bandgap references that are packaged in plastic.

SUMMARY OF THE INVENTION

To meet the above and other objectives, the present invention provides a method of minimizing package-shift effects in integrated circuits such as bandgap reference circuits by using a relatively thick metallic overcoat. A thick layer of metal such as copper is deposited after the patterning of the protective overcoat layer, which itself consists of a rigid insulating material such as silicon nitride. The thickness of the conductive layer applied as part of this invention is substantially greater than the thickness of conventional aluminum metallization (1–2 $\mu$m), but thinner than most existing conformal overcoats. The preferred implementation of the invention employs a layer of electrolytically deposited copper 15–20 $\mu$m thick. Prior art uses various thick stress-absorbing insulating compounds called conformal overcoats, such as dropper applied polyimide and patterned polyimide films. These conformal overcoats are too thick to encapsulate in thin low profile packages. The relatively thick metallic coating proposed with this invention in addition to minimizing package-shift effects, is useful as a low-resistance routing layer. Further, low profile packaging can be implemented since the metallic overcoat is significantly thinner than prior-art solutions.

According to one embodiment, the invention comprises a method of minimizing package-shift effects in integrated circuits including the steps of:

(a) forming an integrated circuit (IC) die;
(b) depositing an insulating protective overcoat over the die and patterning via openings through this layer;
(c) depositing a. thick metallic overcoat on the die;
(d) patterning the thick metallic overcoat, leaving a region of the metallic overcoat completely covering the bandgap reference and/or other sensitive analog circuitry; and
(e) encapsulating the IC die having the thick metallic overcoat deposited thereon with a plastic having filler particles loaded therein, as typically required for reliability issues, wherein the thick metallic overcoat provides a sandwich layer between the die and the filler-loaded plastic, and further wherein the thick metallic overcoat has a thickness having an order of magnitude about the same as the diameter of the filler particles.

According to another embodiment, the invention comprises a method of minimizing package-shift effects in integrated circuits including the steps of:

(a) forming an integrated circuit (IC) die;
(b) depositing an insulating protective overcoat over the die and patterning via openings through this layer;
(c) depositing a thick metallic overcoat on the die;
(d) patterning the thick metallic overcoat, leaving a region of metallic overcoat completely covering the bandgap reference and/or other sensitive analog circuitry; and
(e) encapsulating the IC die with plastic having filler particles loaded therein, wherein the thick metallic overcoat provides a sandwich layer between the die and the plastic such that a substantially uniform stress field is created between the plastic and the die.

According to still another embodiment, the invention comprises an integrated circuit device including:

an integrated circuit (IC) die having a thick metallic overcoat deposited thereon; and
a plastic package encapsulating the IC die having a thick metallic overcoat deposited thereon, wherein the thick metallic overcoat provides a sandwich layer between the die and the plastic package, and further wherein the plastic package comprises plastic having filler particles loaded therein such that the thick metallic overcoat has a thickness having an order of magnitude approximately the same diameter as the filler particles.

In one aspect of the invention, a band gap reference circuit is fabricated using a thick metallic overcoat such as a simple copper overcoat as a stress-relief layer to minimize package-shift effects.

In another aspect of the invention, a bandgap reference circuit is fabricated using a thick metallic overcoat such as a simple copper overcoat to reduce electrical resistance.

In yet another aspect of the invention, a band gap reference circuit is fabricated using a thick metallic overcoat such as a simple copper overcoat to provide an additional routing layer.

In still another aspect of the invention, a bandgap reference circuit is fabricated using a thick metallic overcoat, yet thin relative to previously known solutions, such as a simple copper overcoat to provide a low profile package.

BRIEF DESCRIPTION OF THE DRAWINGS

Other aspects and features of the present invention, and many of the attendant advantages of the present invention, will be better understood by reference to the following detailed description, when considered in connection with the accompanying drawings, in which like reference numerals designate like parts throughout the figures thereof, and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Integrated circuits such as bandgap references packaged in plastic encapsulants have been known to shift in voltage (a pre-package to post-package voltage variation). This package shift is discussed herein below with reference to particular embodiments of the present invention, and experimental results are presented. The main cause of package shift is the package-induced stresses present once the integrated circuit is encapsulated. This package shift is not consistent from unit to unit, even if the same plastic encapsulant and packaging technique are used. For a sample of plastic packaged bandgap reference circuits, the package shift takes the form of a Gaussian distribution, with systematic and random components. The present inventors discovered that die-surface planarization and a relatively thick metallic layer between the die and the plastic encapsulant reduce random and systematic package shifts.

Internal stresses in plastic packages are caused primarily by the difference in coefficient of thermal expansion of the plastic mold compound and the silicon die. Most plastic molding is performed at a temperature of 175° C. to lower the viscosity of the plastic mold. The plastic, which has a typical coefficient of thermal expansion greater than ten times that of silicon, transmits an ever-increasing stress to the chip as the package cools from molding to ambient temperature. While plastic encapsulation is the primary cause of plastic package shift, the process of die attachment to the leadframe can also play a minor role, particularly for dies mounted using solder or gold eutectic bonding.

Figure 1:
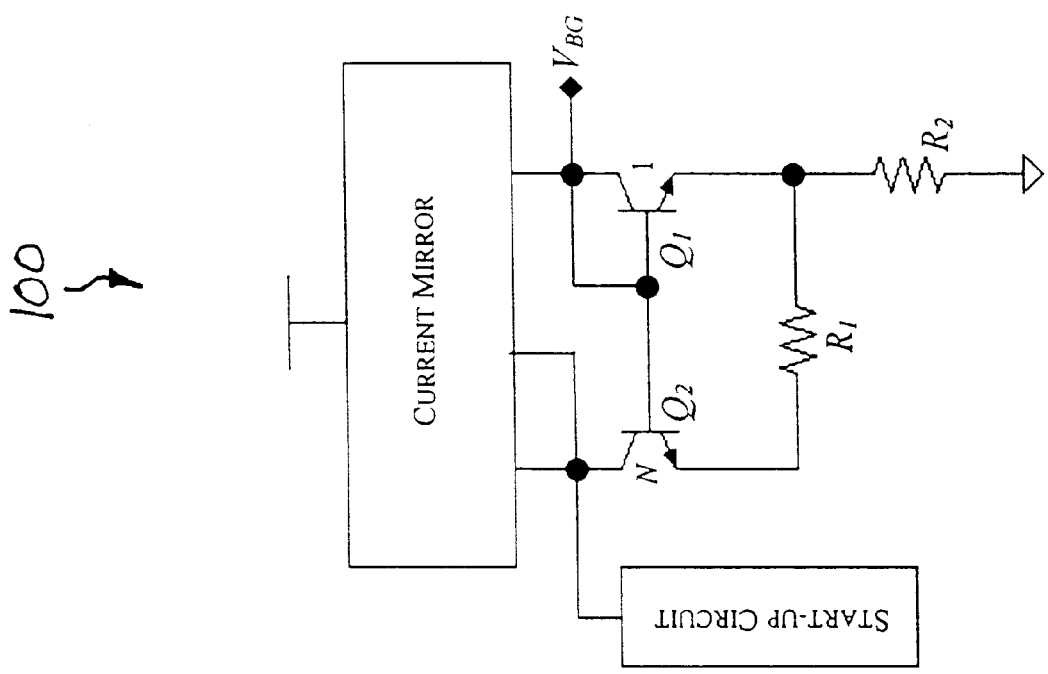
FIG. 1 is a schematic diagram illustrating a first-order Brokaw type bandgap reference circuit that is known in the art.
Figure 2:
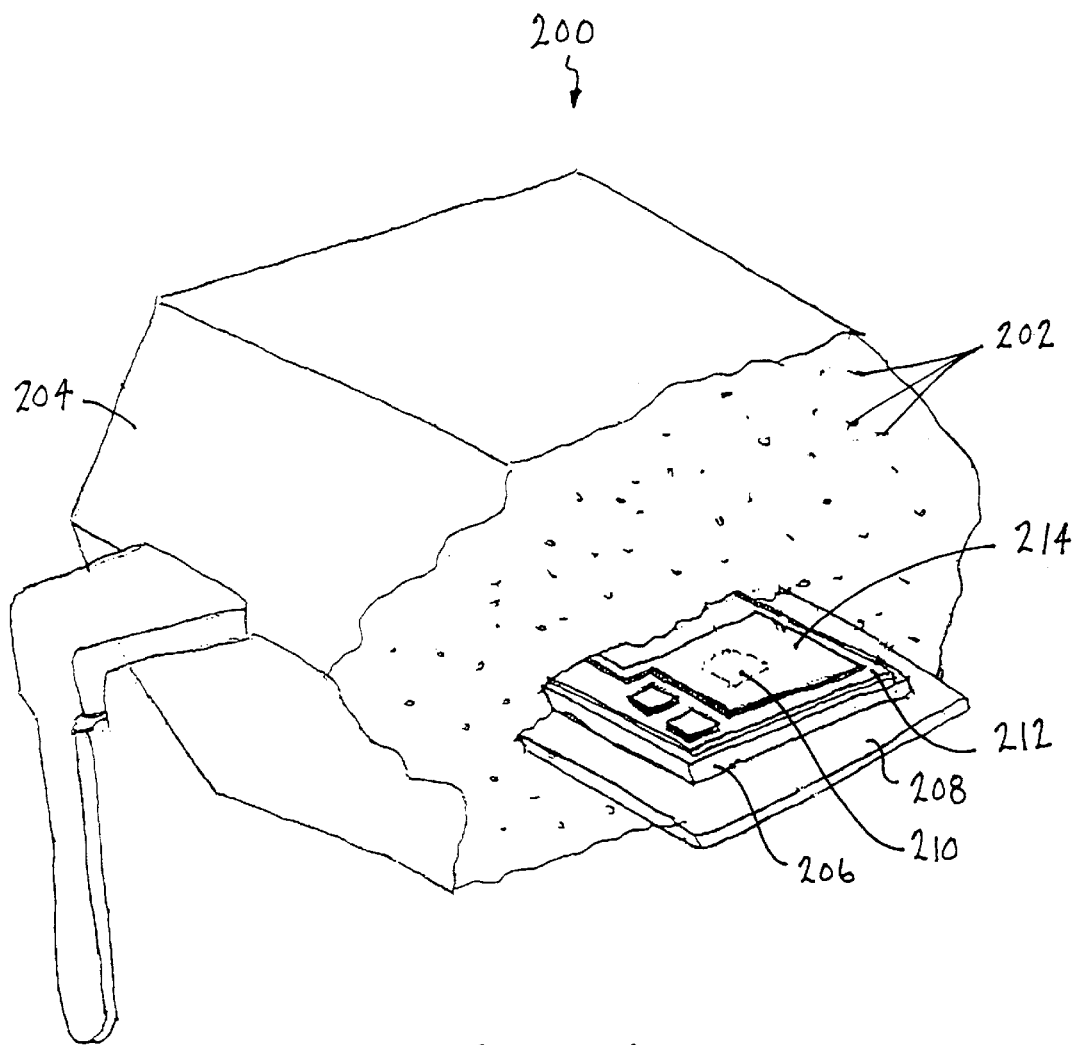
FIG. 2 illustrates a cross-section of a plastic-encapsulated die showing the presence of silica filler particles in the plastic mold.

One of the main stress-related failure mechanisms reported in the literature is the filler-induced mechanism. The mold compound contains filler particles that vary in size and shape, as shown in FIG. 2. FIG. 2 illustrates a cross-section of a plastic-encapsulated die 200 showing the presence of silica filler particles 202 in the plastic mold 204. The plastic-encapsulated die 200 includes a silicon die 206 attached to a mount pad 208 that forms part of a lead frame. A sensitive analog circuit 210 is positioned on the silicon die 206 that is then covered with a protective overcoat 212. A relatively thick metallic overcoat 214 (e.g. copper) is then deposited over the protective overcoat 212 in accordance with one embodiment of the present invention. The filler particles 202 are used, among other reasons, to reduce the thermal coefficient of expansion of the package to prevent destructive effects such as corner and passivation layer cracking, as well as metal-line shifts. These fillers however, exert intense stress fields on localized regions of the die 206, depending upon the size, shape and orientation of the filler particles 202. Such fillers have been reported to cause failures in sense amplifiers of DRAMs, by increasing the source-bulk and drain-bulk leakage currents of MOSFETs by several orders of magnitude.

Figure 3:
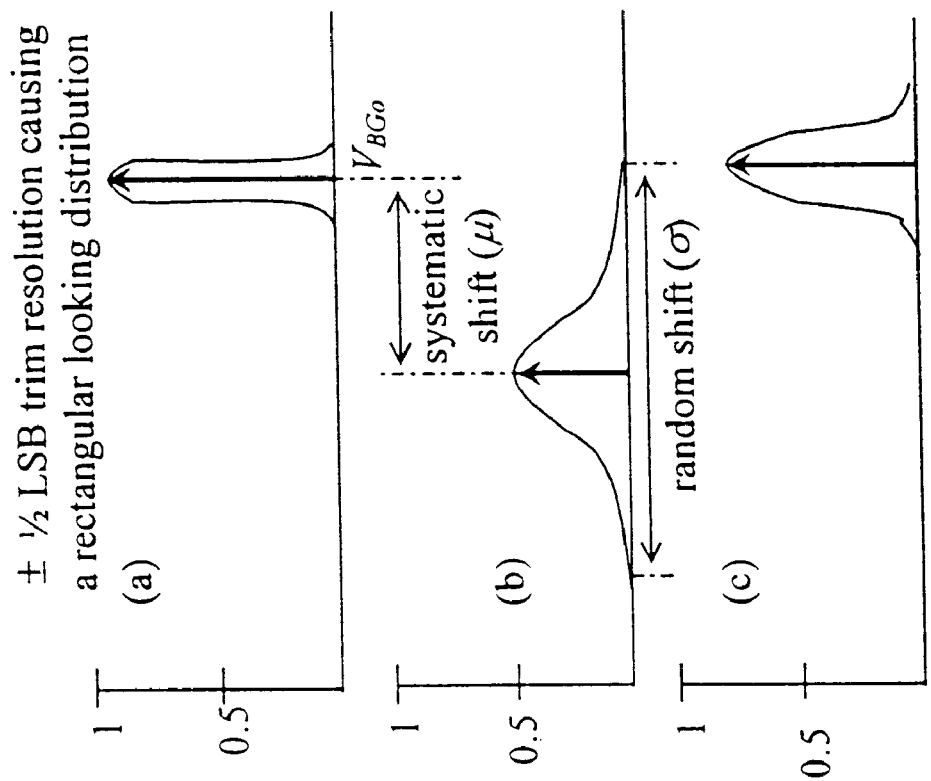
FIG. 3a is a graph illustrating voltage distribution (normalized) before packaging for a sample of bandgap reference circuits trimmed to voltage $V_{BGo}$ within ±½ Least Significant Bit (LSB)
FIG. 3b is a graph illustrating typical voltage distribution (normalized) for a sample of bandgap reference circuits after packaging.
FIG. 3c is a graph illustrating the desired voltage distribution for a bandgap reference after packaging, where the systematic component is trimmed and the random component is minimized.

Because of the complexity and irregularity of the stress in plastic packages, the bandgap package shift from unit to unit is not completely consistent. The package shift can therefore be represented with two components: a systematic mean component and a random component. The systematic mean component is largely based on the particular plastic package used and the process used for packaging, and is reflective of the stress placed on the die by that package type. Consequently, the systematic component can be compensated in the design phase. The random component of the shift, however, is the result of unpredictable variations of the stress matrix and is assumed to conform to a Gaussian distribution. Using statistical analysis, the systematic component can be characterized by the mean ($\mu$) of the distribution and the random component by the standard deviation ($\sigma$). FIG. 3a is a graph illustrating the voltage distribution before packaging for a bandgap reference trimmed to voltage $V_{BGo}$ within ±/−½ LSB. FIG. 3b is a graph illustrating a typical voltage distribution for a bandgap reference circuit after packaging, with a characteristic systematic component and a large random component. The best approach to package shift from a designer's perspective is to trim off the systematic shift and somehow minimize the random shift. FIG. 3c is a graph illustrating the desired voltage distribution for a bandgap reference circuit after packaging, where the systematic component is trimmed, and the random component is minimized. Stress in plastic packages, however, cannot be eliminated unless expensive packaging techniques are employed.

Figure 4:
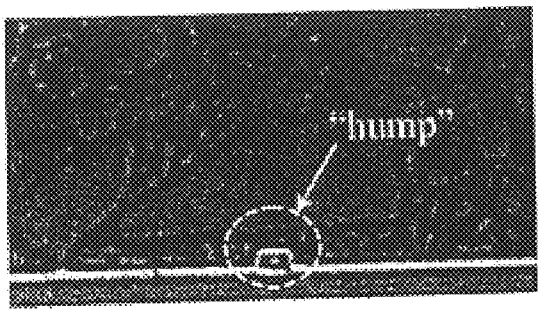
FIG. 4a shows a cross-sectional image of a non-planarized die with plastic mold on top.
FIG. 4b shows a cross-sectional image of a planarized die with plastic mold on top.
FIG. 4c shows an image of a chip with a relatively thick metallic layer placed between the die and the plastic mold on top.
Figure 4:
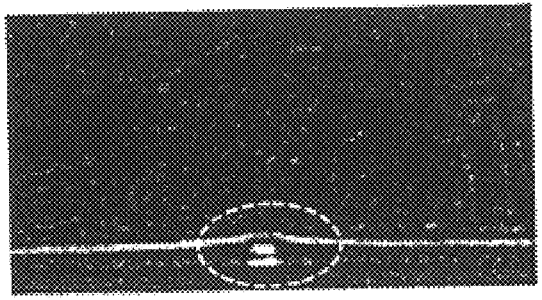
Figure 4:
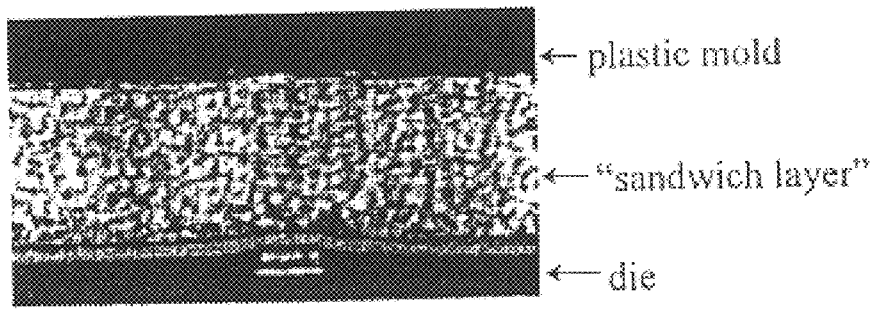
Figure 5:
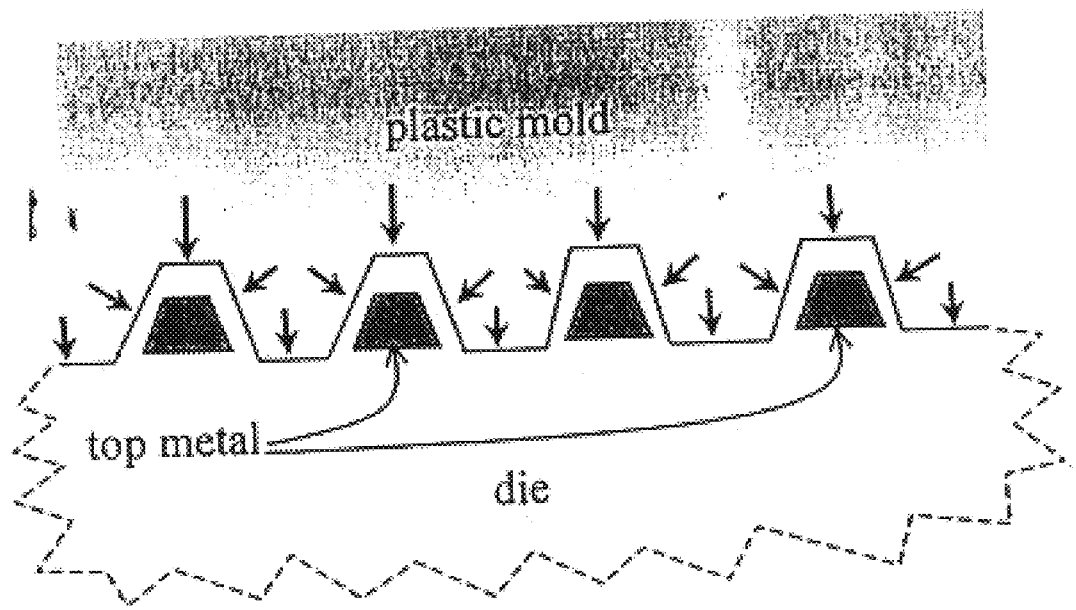
FIG. 5 illustrates a non-uniform stress field resulting from plastic mold in non-planarized areas of a die.

The present inventors have examined the effects of die surface texture and mechanically compliant layers between the die and the plastic encapsulant to achieve a method of minimizing package shift according to particular embodiments of the present invention. Experiments were performed with bandgap reference circuits placed squarely on the center of the die 206, taking care to ensure proper matching of all appropriate devices. The surface of the die was found to have an uneven texture under normal processing, mainly a result of the presence of the top metal layer. The top metal lines were found to yield abrupt topographical "humps" while the pitch between the "humps" created "troughs." The field-oxide and passivation layers on top were found to mimic this incoherent texture. FIG. 4a shows a cross-sectional image of such a non-planarized die. The stress-field from the plastic mold compound, as shown in FIG. 5, was found to be non-uniform, especially in non-planarized areas, due to the presence of the filler particles 202 and the coarse surface texture of the die 206. Such a non-uniform field was found to lead to enhanced random shift behavior. A smooth surface texture and thus a uniform stress field could be achieved by planarizing the surface of the die 206 using resist etchback, chemical-mechanical polishing, or other known techniques. FIG. 4b shows a cross-sectional image of a planarized die.

A relatively thick metallic layer 214 in between the plastic mold and the die surface has been shown to be capable of absorbing some of the stress from the plastic mold compound 204 and minimize the herein before discussed "filler-induced effects" by distancing the die 206 away from the filler-loaded plastic. The filler-induced effect is very random in nature, as stated herein before, depending on the size, the orientation and the position of the filler particles 202 with respect to the chip surface. This metallic (copper) layer 214, about 15 $\mu$m thick (serving as a sandwich layer) according to one embodiment, when applied according to the inventive principles presented herein below, can minimize random and systematic package shift components by achieving a uniform stress field. FIG. 4c shows an image of a chip with such a metallic layer placed between a die and a plastic mold. Prior to depositing the metallic sandwich layer, the die is preferably planarized.

The present inventors designed a test suite to investigate the effects of die surface planarization and a relatively thick metallic layer (copper) on bandgap package shift. The test suite consisted of a well-characterized bandgap reference circuit placed squarely on the center of a die having width and length of 2034 $\mu$m each. The dies were tested to ascertain the effects of planarization and the present inventive metallic layer of about 15 $\mu$m in thickness. Some of the bandgap reference devices were trimmed to 1.2 V before packaging to simulate and statistically analyze the effects of the present planarization and the metallic layer methods in actual production. These devices exhibited a narrow rectangular distribution resulting from finite trim resolution, as depicted in FIG. 5(a). The dies were packaged in 16-pin plastic dual-inline-packages (PDIP). Standard characteristics associated with the leadframe and the plastic mold are shown in Table I below.

TABLE I

Package Characteristics

| MATERIAL | ELASTIC MODULUS (psi) | THERMAL EXPANSION COEFFICIENT (° C.)$^{-1}$ |
|---|---|---|
| Plastic | 1.6–2.0 × 10$^{-6}$ | 17–20 × 10$^{-6}$ |
| Leadframe (copper) | 17.5 × 10$^{-6}$ | 16.5 × 10$^{-6}$ |

Only post-package data was obtained for the devices that were trimmed. Therefore, offset voltage from the "ideal" voltage of 1.2 V was collected for these particular devices, and not the actual package shift.

The statistical mean and the standard deviation results of the package shift for the dies sent through all three process, and post-package voltage variations for the trimmed devices are summarized in Table II below. Table II also shows the number of devices tested. All measurements were taken at room temperature.

TABLE II

Package-Shift Statistics

| | | POST-PACKAGE BANDGAP VOLTAGE SHIFT (UNTRIMMED) | POST-PACKAGE VOLTAGE OFFSET FROM 1.2 V FOR BANDGAP CIRCUITS TRIMMED TO 1.2 V PRE-PACKAGE |
|---|---|---|---|
| NON-PLANARIZED | $\mu$[mV] | −5.06 | −5.1 |
| | 3$\sigma$[mV] | 7.92 | 10.8 |
| | # of DUT | 18 | 27 |
| PLANARIZED | $\mu$[mV] | −4.26 | −4.9 |
| | 3$\sigma$[mV] | 6.51 | 10.34 |
| | # of DUT | 17 | 32 |
| METALLIC LAYER DEPOSITED | $\mu$[mV] | −2.26 | −3.9 |
| | 3$\sigma$[mV] | 4.14 | 7.05 |
| | # of DUT | 10 | 31 |

When planarized, both the mean and the standard deviation of bandgap package shift improved by 16% and 18% respectively. With the metallic overcoat, the mean and the standard deviation improved even further. From the planarized to the metallic overcoat dies, the mean improved by 37% and the standard deviation improved by 36% while improving 47% and 48% respectively, relative to non-planarized dies. This experimental data therefore shows that coating the top of the die with a metallic layer of copper having about 15 $\mu$m in thickness alleviated random package shift by almost one-half. The offset performance of the trimmed devices showed no significant improvement with planarization. A 3$\sigma$ improvement of 35% was achieved however, with the metallic overcoat.

In view of the above, it can be seen that this invention presents a significant advancement in the art of minimizing package-shift effects in integrated circuits. Although the invention has been described in reference to bandgap voltage reference circuits, it is applicable to any integrated circuit that suffers performance degradation due to package shifts. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of minimizing package-shift effects in integrated circuits, comprising the steps of:

(a) forming an integrated circuit (IC) die;

(b) depositing an insulating protective layer over the die and patterning via openings through this layer;

(c) depositing a thick metallic overcoat on the die;

(d) patterning the thick metallic overcoat, leaving a region of metallic overcoat completely covering circuitry that would be deleteriously impacted by packaging stresses; and (e) encapsulating the IC die having the thick metallic overcoat deposited thereon with a plastic compound having filler particles loaded therein, wherein the thick metallic overcoat provides a sandwich layer between the die and the plastic compound.

2. The method according to claim 1 further comprising the step of planarizing the thick metallic overcoat before encapsulating the die in step (e).

3. The method according to claim 1 wherein the step of forming an IC die comprises forming an IC die having a bandgap circuit.

4. The method according to claim 1 wherein the step of depositing a thick metallic overcoat on the die comprises depositing a layer of copper.

5. The method according to claim 4 wherein the step of depositing a layer of copper comprises depositing a layer of copper having a thickness of about 15 $\mu$m.

6. The method according to claim 4 wherein the step of depositing a layer of copper comprises depositing a layer of copper having a thickness of about the same order of magnitude as the diameter of the filler particles.

7. The method according to claim 1 wherein the step of depositing a thick metallic overcoat on the die comprises depositing a metallic overcoat having a relative thickness suitable for use with thin low profile IC packages.

8. The method according to claim 1 wherein the step of depositing a thick metallic overcoat on the die comprises depositing a layer of copper suitable for use as a conductive material for routing and further for decreasing critical path resistances.

9. A method of minimizing package-shift effects in integrated circuits, comprising the steps of:
    (a) forming an integrated circuit (IC) die;
    (b) depositing an insulating protective layer over the die and patterning via openings through this layer;
    (c) depositing a thick metallic overcoat devoid of aluminum on the IC die;
    (d) patterning the thick metallic overcoat, leaving a region of metallic overcoat completely covering circuitry that would be deleteriously impacted by packaging stresses; and
    (e) encapsulating the IC die with plastic having filler particles loaded therein, wherein the thick metallic overcoat provides a sandwich layer between the die and the plastic such that a substantially uniform stress field is created between the plastic and the die.

10. The method according to claim 9 wherein the step of depositing a thick metallic overcoat comprises depositing a layer of copper having a thickness of about 15 $\mu$m.

11. The method according to claim 9 wherein the step of depositing a thick metallic overcoat comprises depositing a layer of copper having a thickness about the same order of magnitude as the diameter of the filler particles.

12. The method according to claim 9 wherein the step of depositing a thick metallic overcoat on the die comprises depositing a metallic overcoat having a relative thickness suitable for use with thin low profile IC packages.

13. The method according to claim 9 further comprising the step of planarizing the thick metallic overcoat before encapsulating the IC die in step (e).

14. The method according to claim 9 wherein the step of forming an IC die comprises forming an IC die having a bandgap circuit.

15. The method according to claim 9 wherein the step of depositing a thick metallic overcoat on the die comprises depositing a layer of copper suitable for use as a conductive material for routing and further for decreasing critical path resistances.

16. A method of minimizing package-shift effects in integrated circuits, comprising the steps of:
    (a) forming an integrated circuit (IC) die;
    (b) depositing an insulating protective layer over the die and patterning via openings through this layer;
    (c) depositing a thick metallic overcoat comprising a layer of copper having a thickness of about 15 $\mu$m on the die;
    (d) patterning the thick metallic overcoat, leaving a region of metallic overcoat completely covering circuitry that would be deleteriously impacted by packaging stresses; and
    (e) encapsulating the IC die having the thick metallic overcoat deposited thereon with a plastic compound having filler particles loaded therein, wherein the thick metallic overcoat provides a sandwich layer between the die and the plastic compound.

17. A method of minimizing package-shift effects in integrated circuits, comprising the steps of:
    (a) forming an integrated circuit (IC) die;
    (b) depositing an insulating protective layer over the die and patterning via openings through this layer;
    (c) depositing a thick metallic overcoat devoid of aluminum on the IC die wherein the thick metallic overcoat comprises a layer of copper having a thickness of about 15 $\mu$m;
    (d) patterning the thick metallic overcoat, leaving a region of metallic overcoat completely covering circuitry that would be deleteriously impacted by packaging stresses; and
    (e) encapsulating the IC die with plastic having filler particles loaded therein, wherein the thick metallic overcoat provides a sandwich layer between the die and the plastic such that a substantially uniform stress field is created between the plastic and the die.

* * * * *